(12) United States Patent
Yarino et al.

(10) Patent No.: US 8,922,687 B2
(45) Date of Patent: Dec. 30, 2014

(54) SOLID-STATE IMAGING DEVICE

(71) Applicant: Panasonic Corporation, Kadoma (JP)

(72) Inventors: Makoto Yarino, Kyoto (JP); Takahiro Yamamoto, Osaka (JP); Yoshiyuki Matsunaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 13/722,929

(22) Filed: Dec. 20, 2012

(65) Prior Publication Data

US 2013/0107095 A1    May 2, 2013

Related U.S. Application Data

(63) Continuation of application No. PCT/JP2011/003940, filed on Jul. 8, 2011.

(30) Foreign Application Priority Data

Jul. 9, 2010 (JP) .................................. 2010-157292

(51) Int. Cl.
| | |
|---|---|
| H04N 3/14 | (2006.01) |
| H04N 5/335 | (2011.01) |
| H04N 5/363 | (2011.01) |
| H04N 5/369 | (2011.01) |
| H04N 5/357 | (2011.01) |
| H01L 27/146 | (2006.01) |
| H04N 5/374 | (2011.01) |

(52) U.S. Cl.
CPC .......... *H01L 27/14612* (2013.01); *H04N 5/363* (2013.01); *H04N 5/3698* (2013.01); *H04N 5/3577* (2013.01); *H04N 5/335* (2013.01); *H04N 5/3742* (2013.01); *H01L 27/14643* (2013.01); *H01L 27/14609* (2013.01)
USPC ........... 348/294; 348/298; 348/302; 348/308; 348/312

(58) Field of Classification Search
USPC .......................... 348/294, 298, 302, 308, 312; 250/208.1; 257/290–292
See application file for complete search history.

(56) References Cited

U.S. PATENT DOCUMENTS

| | | | |
|---|---|---|---|
| 4,363,963 | A | 12/1982 | Ando |
| 6,091,449 | A | 7/2000 | Matsunaga et al. |

(Continued)

FOREIGN PATENT DOCUMENTS

| | | |
|---|---|---|
| JP | 55-120182 A | 9/1980 |
| JP | 58-050030 B2 | 11/1983 |

(Continued)

OTHER PUBLICATIONS

International Search Report issued in International Application No. PCT/JP2011/003940 issued on Sep. 27, 2011.

*Primary Examiner* — Yogesh Aggarwal
(74) *Attorney, Agent, or Firm* — McDermott Will & Emery LLP

(57) ABSTRACT

A solid-state imaging device including pixels, each pixel having a reset transistor, a selection transistor, an amplification transistor, and a photoelectric conversion unit. The photoelectric conversion unit has a photoelectric conversion film which performs photoelectric conversion, a pixel electrode formed on the surface of the photoelectric conversion film that faces the semiconductor substrate, and a transparent electrode formed on the surface of the photoelectric conversion film that is opposite to the pixel electrode, and the amplitude of a row reset signal applied to the gate of the reset transistor is smaller than at least one of (a) the maximum voltage applied to the drain of the amplification transistor, (b) the maximum voltage applied to the gate of the selection transistor, (c) the power source voltage applied to an inverting amplifier, and (d) the maximum voltage applied to a transparent electrode.

15 Claims, 7 Drawing Sheets

(56) References Cited

U.S. PATENT DOCUMENTS

| | | |
|---|---|---|
| 6,239,839 B1 | 5/2001 | Matsunaga et al. |
| 6,300,978 B1 | 10/2001 | Matsunaga et al. |
| 6,469,740 B1 | 10/2002 | Kuroda et al. |
| 6,697,111 B1 | 2/2004 | Kozlowski et al. |
| 6,777,660 B1 | 8/2004 | Lee |
| 6,795,121 B2 | 9/2004 | Matsunaga et al. |
| 7,113,213 B2 | 9/2006 | Matsunaga et al. |
| 7,274,397 B2 | 9/2007 | Fowler |
| 7,369,169 B2 | 5/2008 | Matsunaga et al. |
| 2001/0013901 A1 | 8/2001 | Matsunaga et al. |
| 2001/0052941 A1 | 12/2001 | Matsunaga et al. |
| 2002/0149688 A9 | 10/2002 | Matsunaga et al. |
| 2003/0151686 A1* | 8/2003 | Koyama .................. 348/304 |
| 2005/0012839 A1 | 1/2005 | Matsunaga et al. |
| 2005/0036048 A1 | 2/2005 | Fowler |
| 2010/0020217 A1* | 1/2010 | Abe et al. ................ 348/308 |

FOREIGN PATENT DOCUMENTS

| | | |
|---|---|---|
| JP | 10-281870 A | 10/1998 |
| JP | 2005-065270 A | 3/2005 |
| WO | WO-97/07631 A1 | 2/1997 |

* cited by examiner

SOLID-STATE IMAGING DEVICE

CROSS REFERENCE TO RELATED APPLICATIONS

This is a continuation application of PCT International Application No. PCT/JP2011/003940 filed on Jul. 8, 2011, designating the United States of America, which is based on and claims priority of Japanese Patent Application No. 2010-157292 filed on Jul. 9, 2010. The entire disclosures of the above-identified applications, including the specifications, drawings and claims are incorporated herein by reference in their entirety.

FIELD

The present invention relates to a solid-state imaging device, and particularly to a layered solid-state imaging device.

BACKGROUND

A typical solid-state imaging device has a light receiving unit which adopts an embedded photodiode structure.

Japanese Unexamined Patent Application Publication No. 55-120182 discloses a so-called layered solid-state imaging device, in which a photoelectric conversion layer is formed on a control electrode comprised by the solid-state imaging device, and a transparent electrode layer is disposed on the photoelectric conversion layer, and which converts optical information to an electric signal with a favorable SN ratio by applying the effect of a voltage applied to the transparent electrode layer to a control electrode via the photoelectric conversion layer.

CITATION LIST

Patent Literature

Japanese Unexamined Patent Application Publication No. 55-120182

SUMMARY

Technical Problem

A layered solid-state imaging device has a structure in which a photoelectric conversion film is formed on a semiconductor substrate including pixel circuits with an insulating film interposed between the photoelectric conversion film and the semiconductor substrate. Thus, a material with a high optical absorption coefficient, such as an amorphous silicon can be used in the photoelectric conversion film. For example, in the case where an amorphous silicon is used, a green light with a wavelength of 550 nm can be mostly absorbed by the photoelectric conversion film with a thickness of approximately 0.4 nm.

Because an embedding photodiode is not used, the capacitance of a photoelectric conversion unit can be increased, and thus saturation charge amount can be increased. In addition, because electric charges are not completely transferred, additional capacitance can be further increased, a sufficiently high capacitance can be achieved also in a pixel with a finer structure. Furthermore, a structure like a stacked cell in a dynamic random access memory can be adopted.

However, in the solid-state imaging device disclosed in Japanese Unexamined Patent Application Publication No. 55-120182, the photoelectric conversion film is formed apart from the surface of a semiconductor substrate, and thus the photoelectric conversion film and the semiconductor substrate surface need to be electrically connected. Therefore, the above solid-state imaging device has a problem in that the value of dark current is increased, which is not the case in an embedded photodiode (PD).

First, because a general solid-state imaging device with an embedded photodiode can transfer electric charges almost completely, fixed pattern noise can be cancelled by a CDS circuit performing sampling in such a manner that (signal level+fixed pattern noise)−(black level+fixed pattern noise)= signal level, and there is known a method by which noise is reduced to by a factor of $1/\sqrt{2}$ by using a combination of a strong inversion operation and a weak inversion operation of the reset transistor when a signal is reset. This method cannot be applied to the layered solid-state imaging device disclosed in Japanese Unexamined Patent Application Publication No. 55-120182.

A solid-state imaging device of conventional art has an amplification transistor in each pixel, which serves as a driving element. However, in the case where a variation occurs in transistor characteristics, for example, threshold voltage of transistor (hereinafter referred to as Vth) in a state with no signal charge, incident light with a uniform quantity of light enters the photoelectric conversion unit, and thus the output value of transistor varies even in a state where the potentials of operation control units are equal. Consequently, spatial fixed pattern noise occurs and the image quality significantly deteriorates.

In addition, in a solid-state imaging device of conventional art, fixed pattern noise occurs due to a variation in the capacitance between the reset transistor and the amplification transistor at the time of reading a signal charge. Because a layered solid-state imaging device cannot transfer electric charge completely, even when sampling is performed by a CDS circuit as in the above-mentioned solid-state imaging device with an embedded photodiode, the fixed pattern noise cannot be cancelled completely. Because the subsequent signal charge is added to the previous one in a state where noise is present, a signal charge with superimposed fixed pattern noise is read. Therefore, the fixed pattern noise is increased. That is to say, the solid-state imaging device disclosed in Japanese Unexamined Patent Application Publication No. 55-120182 has a problem in that the fixed pattern noise tends to increase in contrast to a general solid-state imaging device with a photodiode.

In addition, a layered solid-state imaging device has a problem in that random noise occurs via capacitive coupling between a reset signal line and a pixel electrode, due to the trailing edge of the reset pulse included in the reset signal. It should be noted that when the reset pulse included in a reset signal is a positive pulse (upward pulse), the trailing edge (rear edge) of the reset pulse is a falling edge, whereas when the reset pulse is a negative pulse (downward pulse), the trailing edge is a rising edge.

In view of the above-described problem, it is an object of the present invention is provide a layered solid-state imaging device capable of achieving reduction of noise such as random noise or fixed pattern noise.

Solution to Problem

In order to solve the aforementioned problem, a solid-state imaging device according to an aspect of the present invention includes: a plurality of pixels arranged in rows and columns above a semiconductor substrate; a row scanning unit configured to generate a row reset signal; and an inverting amplifier formed for each column, wherein each of the pixels has a reset transistor, a selection transistor, an amplification transistor, and a photoelectric conversion unit, the photoelectric conversion unit has a photoelectric conversion film which performs photoelectric conversion, a pixel electrode formed on a surface of the photoelectric conversion film that faces the semiconductor substrate, and a transparent electrode formed on a surface of the photoelectric conversion film that is opposite to the pixel electrode, the amplification transistor has a gate connected to the pixel electrode, and outputs a signal voltage according to a potential of the pixel electrode to a column signal line via the selection transistor, the row scanning unit is configured to supply the row reset signal to a gate of the reset transistor, and an amplitude of the row reset signal is smaller than at least one of (a) a maximum voltage applied to a drain of the amplification transistor, (b) a maximum voltage applied to a gate of the selection transistor, (c) a power source voltage applied to the inverting amplifier, and (d) a maximum voltage applied to the transparent electrode.

With the above configuration, the row reset signal has an amplitude smaller than at least one of the above-mentioned (a) to (d), and thus random noise due to the trailing edge of the reset pulse included in the reset signal can be reduced.

The solid-state imaging device may further include: a column signal line formed for each column; an inverting amplifier connected to the column signal line; and a feedback line which is provided for each column and feeds back an output signal of the inverting amplifier to the pixels of a corresponding column, wherein the amplification transistor has a gate connected to the pixel electrode, and outputs a signal voltage according to the potential of the pixel electrode to the column signal line via the selection transistor, and one of a source and a drain of the reset transistor is connected to the pixel electrode, and the other of a source and a drain of the reset transistor is connected to a corresponding feedback line.

With the above configuration, reset noise is reduced by feeding back the output of the inverting amplifier, the reset noise being generated when the signal charge of the pixel electrode is reset by the reset transistor. Accordingly, superposition of the reset noise on the subsequent signal charge occurs less frequently, and thus random noise can be reduced. In addition, noise due to a circuit variation (for example, a variation in Vth of the amplification transistor for each column) can be reduced.

The row scanning unit may be further configured to receive an input of a row reset signal having a waveform that is unadjusted and an amplitude equivalent to a power source voltage, and to adjust a waveform of the row reset signal to reduce the amplitude of the row reset signal.

An amplitude of the row reset signal applied to the gate of the reset transistor may be smaller than the maximum voltage applied to the drain of the amplification transistor.

An amplitude of the row reset signal applied to the gate of the reset transistor may be smaller than the maximum voltage applied to the gate of the selection transistor.

An amplitude of the row reset signal applied to the gate of the reset transistor may be smaller than the power source voltage applied to the inverting amplifier.

An amplitude of the row reset signal applied to the gate of the reset transistor may be smaller than the maximum voltage applied to the transparent electrode.

The amplitude of the row reset signal applied to the gate of the reset transistor may be smaller than any one of (a) the maximum voltage applied to the drain of the amplification transistor, (b) the maximum voltage applied to the gate of the selection transistor, (c) the power source voltage applied to the inverting amplifier, and (d) the maximum voltage applied to the transparent electrode.

The solid-state imaging device may further include a waveform adjusting unit configured to adjust a waveform of a row reset signal to be applied to the gate of the reset transistor, wherein the waveform adjusting unit is configured to adjust the waveform, so that a trailing edge of a reset pulse included in the row reset signal is inclined, and to supply the adjusted reset pulse to the gate of the reset transistor.

The solid-state imaging device may have switchable functions of capturing an image at a first frame rate and capturing an image at a second frame rate higher than the first frame rate, and the waveform adjusting unit is configured to adjust an inclination of the trailing edge, so that a transition time required for falling or rising of the trailing edge of the reset pulse in the capturing at the first frame rate is longer than a transition time required for falling or rising of the trailing edge of the reset pulse in the capturing at the second frame rate.

With the above configuration, in a layered solid-state imaging device capable of capturing an image at a frame rate according to the current scene, noise can be reduced according to various frame rates.

The waveform adjusting unit may be a filter circuit which is installed in a reset control line connected to the gate of the reset transistor.

The waveform adjusting unit may be configured to adjust an inclination of the trailing edge of the reset pulse by changing a circuit constant of the filter circuit.

The waveform adjusting unit may include a digital-analog converter which outputs an analog signal as the row reset signal, the analog signal having an inclination at the trailing edge of the reset pulse.

The solid-state imaging device may further include a waveform adjusting unit configured to adjust a waveform of a row reset signal to be applied to the gate of the reset transistor, wherein the waveform adjusting unit is configured to adjust a frequency band included in the trailing edge of the reset pulse in the row reset signal.

A driving method for a solid-state imaging device including: a plurality of pixels arranged in rows and columns on a semiconductor substrate; a row scanning unit configured to generate a row reset signal; and an inverting amplifier formed for each column, wherein each of the pixels has a reset transistor, a selection transistor, an amplification transistor, and a photoelectric conversion unit, the photoelectric conversion unit has a photoelectric conversion film which performs photoelectric conversion, a pixel electrode formed on a surface of the photoelectric conversion film that faces the semiconductor substrate, and a transparent electrode formed on a surface of the photoelectric conversion film that is opposite to the pixel electrode, and the amplification transistor has a gate connected to the pixel electrode, and outputs a signal voltage according to a potential of the pixel electrode to the column signal line via the selection transistor, the driving method including: outputting the output signal of the amplification transistor to the column signal line by enabling a row selection signal to the gate of the selection transistor; and supplying the row reset signal, to a gate of the reset transistor, the row reset signal having an amplitude smaller than at least one of (a) a maximum voltage applied to a drain of the amplification transistor, (b) a maximum voltage applied to the gate of the selection transistor, (c) a power source voltage applied to the inverting amplifier, and (d) a maximum voltage applied to the transparent electrode.

Advantageous Effects

In the solid-state imaging device according an aspect of the present invention, a circuit variation (fixed pattern noise due to a variation in Vth of the amplification transistor for each column) can be reduced by a feedback circuit, and a variation (fixed pattern noise) in the capacitance between the reset transistor and the amplification transistor can be reduced by setting the reset amplitude at the time of reading a signal charge in a reset OFF state to be small equivalent to 0V or close to 0V.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Embodiment 1

Figure 1:
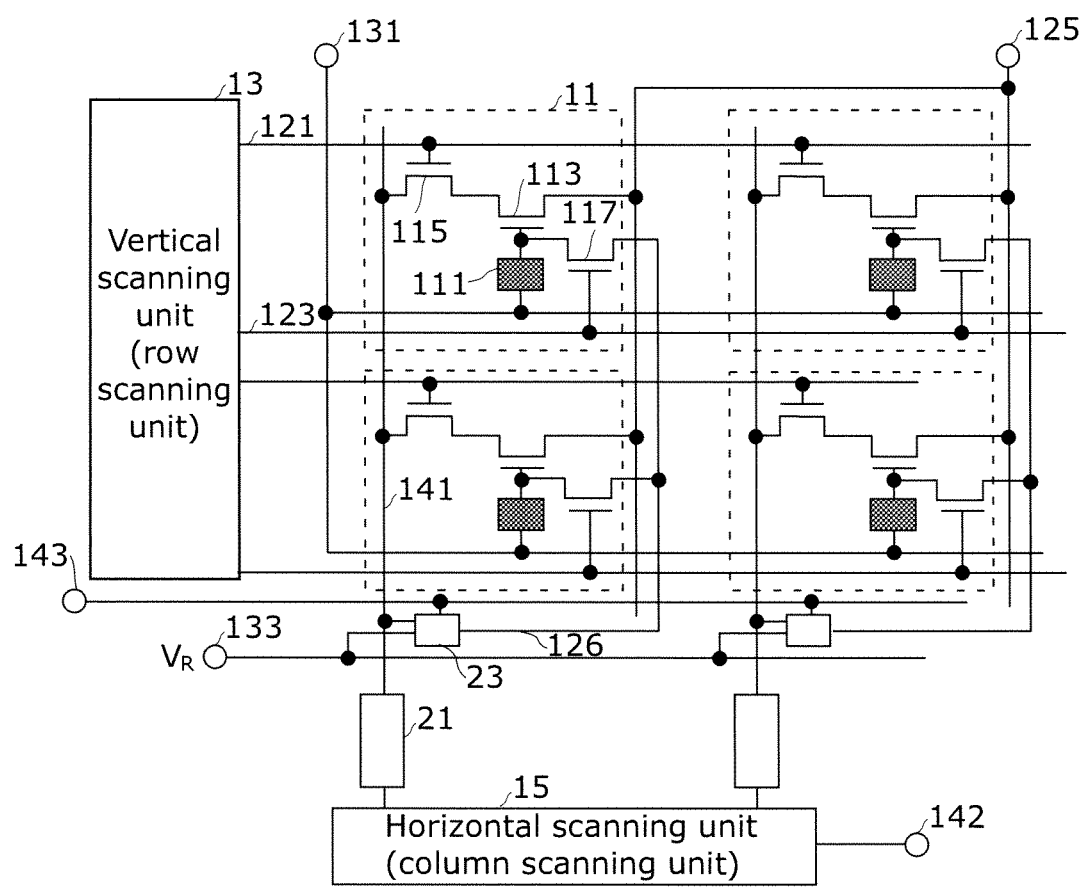
FIG. 1 is a circuit diagram illustrating a solid-state imaging device according to Embodiment 1.
Figure 2:
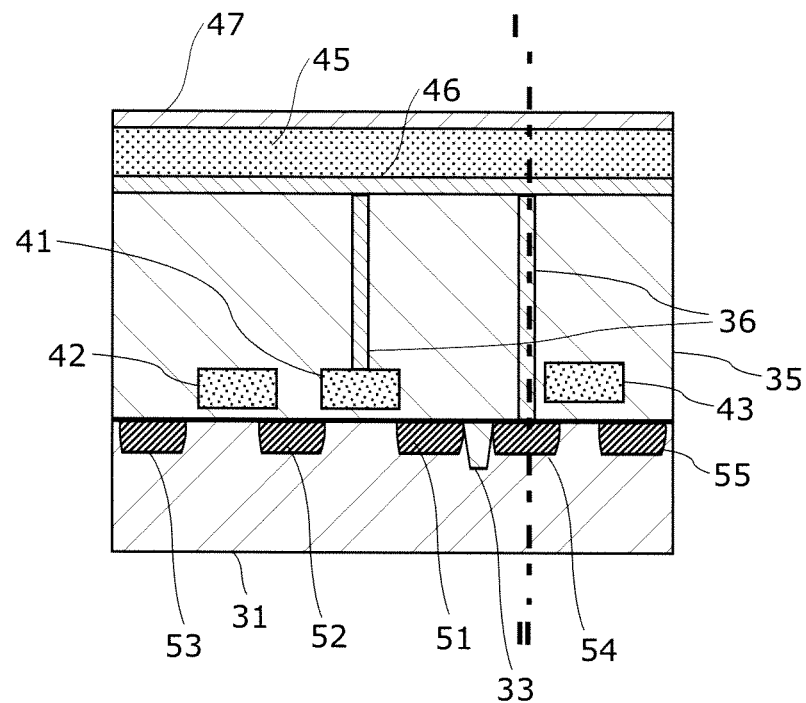
FIG. 2 is a cross-sectional view illustrating a pixel of a solid-state imaging device according to Embodiment 1.

A solid-state imaging device of the present embodiment is a layered solid-state imaging device, and FIG. 1 illustrates the circuit configuration of the solid-state imaging device according to the present embodiment. FIG. 2 illustrates the cross-sectional configuration of a pixel 11 of FIG. 1 in the solid-state imaging device of the present embodiment.

As illustrated in FIG. 1, the solid-state imaging device includes a plurality of pixels 11 arranged in rows and columns, a vertical scanning unit (also referred to as a row scanning unit) 13 for supplying various timing signals to the pixel 11, a horizontal scanning unit (also referred to as a column scanning unit or a horizontal signal reading unit) 15 for successively reading a signal of the pixel 11 for a horizontal output terminal 142, a vertical signal line (also referred to as a column signal line) 141 formed for each column, an inverting amplifier 23 connected to the column signal line 141, and a feedback line 126 disposed in each column for feeding back an output signal of the inverting amplifier 23 to the pixel 11 of a corresponding column. In FIG. 1, the pixel 11 has two rows and two columns, however, the pixel 11 may have any number of rows and columns.

As illustrated in FIG. 2, a semiconductor substrate 31 composed of silicon includes an amplification transistor 113, a selection transistor 115, and a reset transistor 117. The amplification transistor 113 has a gate electrode 41, a diffusion layer 52 as a drain, and a diffusion layer 51 as a source. The selection transistor 115 has a gate electrode 42, the diffusion layer 52 as a drain, and a diffusion layer 53 as a source. The source of the amplification transistor and the drain of the selection transistor 115 form a common diffusion layer. The reset transistor 117 has a gate electrode 43, a diffusion layer 54 as a source, and a diffusion layer 55 as a drain. The diffusion layer 51 and the diffusion layer 54 are separated from each other by an element isolation region 33.

An insulating film 35 is formed on the semiconductor substrate 31 so as to cover the transistors.

A photoelectric conversion unit 111 is formed on the insulating film 35. The photoelectric conversion unit 111 has a photoelectric conversion film 45 composed of an amorphous silicon or the like, a pixel electrode 46 formed on the lower surface of the photoelectric conversion film 45, and a transparent electrode 47 formed on the upper surface of the photoelectric conversion film 45. The pixel electrode 46 is connected via a contact 36 to the gate electrode 41 of the amplification transistor 113, and the diffusion layer 54 which is the source of the reset transistor 117. The diffusion layer 54 connected to the pixel electrode 46 serves as an accumulation diode.

The pixel 11 includes a photoelectric conversion unit 111, the amplification transistor 113 having a gate connected to the photoelectric conversion unit 111, the reset transistor 117 having a drain connected to the photoelectric conversion unit 111, and the selection transistor 115 having a drain connected to the source of the amplification transistor 113.

As illustrated in FIG. 2, the photoelectric conversion unit 111 has the photoelectric conversion film 45 for performing photoelectric conversion, the pixel electrode 46 formed on the surface of the photoelectric conversion film 45 that faces the semiconductor substrate 31, and the transparent electrode 47 formed on the surface of the photoelectric conversion film 45 opposite to the pixel electrode 46. The photoelectric conversion unit 111 is connected between the gate of the amplification transistor 113, the drain of the reset transistor 117, and a photoelectric conversion unit control line 131. The amplification transistor 113 is connected to a power source 125, has the gate connected to the pixel electrode 46, and outputs a signal voltage according to the potential of the pixel electrode 46 to the column signal line 141 via the selection transistor 115. One of the source and the drain of the reset transistor 117 is connected to the pixel electrode 46, and the other is connected to a corresponding feedback line 126. The source of the selection transistor 115 is connected to a corresponding vertical signal line 141. The gate of the selection transistor 115 is connected to the vertical scanning unit 13 via an address control line 121. The gate of the reset transistor 117 is connected to the vertical scanning unit 13 via a reset control line 123. In the present embodiment, an example is described in which the reset transistor 117 is an n-type MOS transistor, the reset pulse included in a reset signal inputted to the gate is a positive pulse (upward pulse), and the trailing edge of the reset pulse is a falling edge. The address control line 121 and the reset control line 123 are provided for each row. The photoelectric conversion unit control line 131 is common to all pixels. The vertical signal line 141 is provided for each column, and is connected to the horizontal signal reading unit 15 via a column signal processing unit 21. The column signal processing unit 21 performs noise reduction signal processing represented by correlation double sampling.

The vertical scanning unit 13 supplies a row reset signal to the gate of the reset transistor 117. The amplitude of the row reset signal is smaller than at least one of (a) the maximum voltage applied to the drain of the amplification transistor, (b) the maximum voltage applied to the gate of the selection transistor, (c) the power source voltage applied to the inverting amplifier, and (d) the maximum voltage applied to the transparent electrode. This is for the purpose of reducing random noise caused by the trailing edge (falling edge) of the reset pulse included in the row reset signal by setting the amplitude of the row reset signal smaller than that of other signal lines.

The vertical signal line 141 provided for each column is connected to the inverting amplifier 23 which receives an input of a reference voltage (VR) 133 common to all pixels, and the output of the inverting amplifier 23 is connected to the source of the reset transistor 117. When the selection transistor 115 and the reset transistor 117 are in a conduction state, the reset transistor 117 receives the output of the selection transistor 115 and performs a feedback operation, so that the gate potential of the amplification transistor 113 has substantially the same potential as the reference voltage (VR) 133 of the inverting amplifier 23. In the above process, the output of the inverting amplifier 23 is 0V or a positive voltage close to 0V.

Figure 3A:
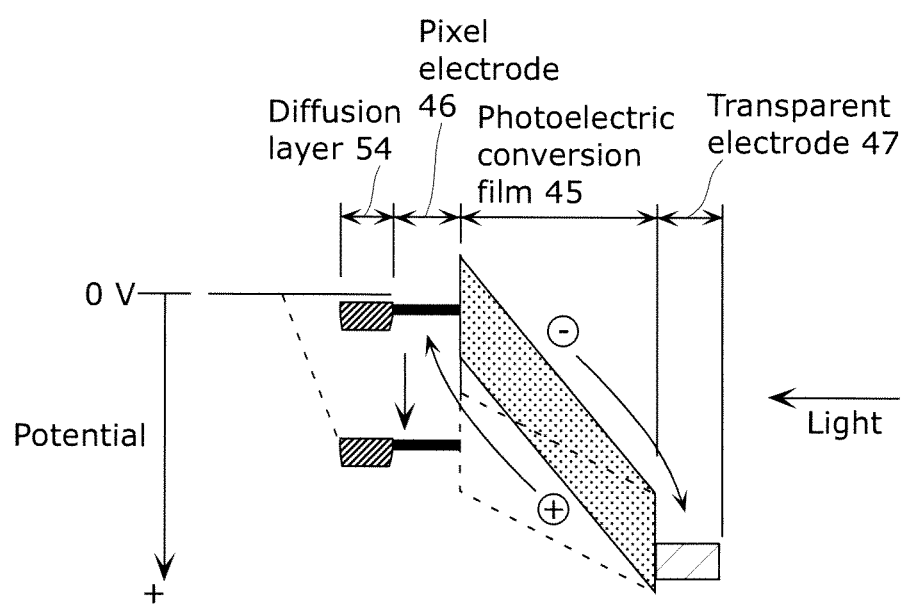
FIG. 3A is a schematic graph illustrating a potential in a cross-section along a line I-II of FIG. 2.
Figure 3B:
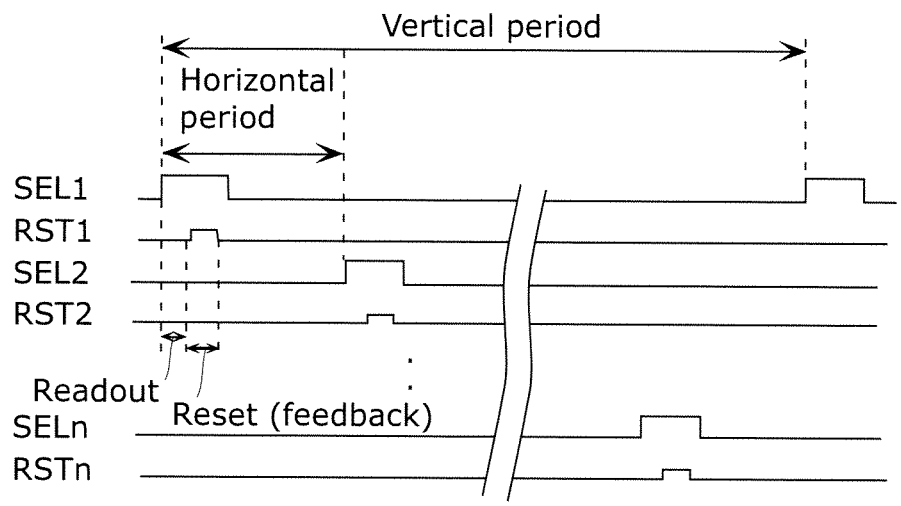
FIG. 3B is a time chart illustrating the operation of the solid-state imaging device according to Embodiment 1.

FIG. 3B is a time chart illustrating the most basic imaging operation of the solid-state imaging device. SEL1 in FIG. 3B indicates a row selection signal for the first row. RST1 indicates a row reset signal for the first row. Similarly, SEL2 and RST2 are defined for the second row. The amplitude of the row reset signal is smaller than at least one of the above-mentioned (a) to (d).

A horizontal period in FIG. 3B is a time period from enabling of a row selection signal to enabling of the subsequent row selection signal (from the rising of SEL1 to the rising of SEL2), which is required for reading a signal voltage from the pixels 11 in a single row. A vertical period is a time period required for reading a signal voltage from the pixels 11 of all rows.

A feedback operation is performed when a row selection signal and a row reset signal are enabled simultaneously. That is to say, a feedback operation is performed when the selection transistor 115 and the reset transistor 117 are turned on simultaneously. As illustrated in FIG. 3B, the vertical scanning unit 13 is controlled to reset the relevant row (feedback operation), after reading a signal from the pixel 11. First, the selection transistor 115 is turned on by enabling a row selection signal to the gate of selection transistor 115, and an output signal of the amplification transistor is outputted to the column signal line 141. Subsequently, a row reset signal is enabled when a certain time has elapsed after the row selection signal is enabled, and thus the output of inverting amplifier 23 is fed back to the pixel electrode 46 via the reset transistor 117.

By the feedback operation, fixed pattern noise caused by a variation in Vth of the amplification transistor for each column is reduced, the variation being generated when a signal charge is reset by the reset transistor 117. Accordingly, superposition of fixed pattern noise on the subsequent signal charge occurs less frequently, and thus the fixed pattern noise can be reduced.

A specific example of the inverting amplifier 23 is described below. A differential amplifier circuit such as an operational amplifier is used in such a manner that the output of the selection transistor 115 is inputted the negative side of the differential amplifier circuit via the vertical signal line 141, the reference voltage (VR) 133 is inputted to the positive side of the differential amplifier circuit, and the output of the differential amplifier circuit is connected to the source of the reset transistor 117. Then the differential amplifier circuit operates to generate an output, so that a signal inputted to the negative side approaches a signal inputted to the positive side. The inverting amplifier 23 may not be limited to the above circuit configuration.

Because the photoelectric conversion unit 111 having a large optical absorption coefficient is used in the present invention, quantum efficiency is considerably high, and therefore, the effect obtained when the fixed pattern noise is reduced is significantly higher than that of a solid-state imaging device having a conventional structure. In addition, because the photodiode area can be reduced in the present invention, a conversion gain can be increased in the relevant circuit, the effect obtained when the fixed pattern noise is reduced is considerably high. Furthermore, because the present invention provides a structure in which photoelectric conversion is not performed within the semiconductor substrate 31, the effect obtained when the fixed pattern noise is reduced is significantly high.

In this manner, with the configuration of Embodiment 1, the voltage applied to the source of the reset transistor 117 becomes 0V or close to 0V by performing the feedback operation using the inverting amplifier 23 on each vertical signal line 141. Thus the fixed pattern noise of a layered solid-state imaging device can be reduced, and readout of signal charge with superimposed fixed pattern noise occurs less frequently, and consequently, the fixed pattern noise can be reduced.

Embodiment 2

In FIG. 1, description is given under the assumption that the amplification transistor 113, the selection transistor 115, and the reset transistor 117 are n-channel type transistors, which are formed on a p-type semiconductor substrate, and has an n-type diffusion layer. In the case of FIG. 2, reference number 31 indicates a p-type semiconductor substrate, and reference numbers 41 to 43, and 51 to 55 indicate n-channel type transistors having a n-type diffusion layer. However, because the output of the inverting amplifier 23 is 0V or a positive voltage close to 0V, the amplification transistor 113 is preferably a depletion type transistor. The basic circuit configuration can be made with FIG. 1 of Embodiment 1.

FIG. 3A is a schematic graph illustrating a potential in a cross-section along a line I-II of FIG. 2. First, in a state where there is no signal (reset state), the potential of the diffusion layer 54, which is an accumulation diode, is substantially 0 v, and a small reverse bias is being applied to the diffusion layer 54. In the case where approximately 25 mV of reverse bias is caused by thermal noise, part of the charges in the accumulation diode may escape to the substrate side. Therefore, the applied reverse bias during a period of signal charge accumulation is preferably approximately 0.1V or higher. By setting the potential of the accumulation diode to nearly 0V, a reverse-direction leakage current (dark current) flowing between the accumulation diode and the semiconductor substrate 31 can be reduced. On the other hand, a positive voltage is applied to the transparent electrode 47. Incident light from the top of the transparent electrode 47 passes through the transparent electrode 47 to enter the photoelectric conversion film 45, and is converted to an electron hole pair. The electron of the converted electron hole pair is transferred to the transparent electrode 47, and flows through a power source (not illustrated) connected to the transparent electrode 47. The positive hole is transferred to the diffusion layer 54, and is accumulated therein. Therefore, the potential of the diffusion layer 54 is shifted in a positive direction, and a voltage is applied between the diffusion layer 54 and the semiconductor substrate 31. Thus, a reverse-direction leakage current (dark current) flows between the diffusion layer 54 and the semiconductor substrate 31, thereby causing noise. However, in a state where there is a signal, noise is not noticeable, and thus no problem arises.

The voltage which has been shifted to a positive direction by the positive holes accumulated in the diffusion layer 54 is transferred to the gate electrode 41 of the amplification transistor 113, and a signal amplified by the amplification transistor 113 is outputted to the vertical signal line 141 via the selection transistor 115.

In a conventional general solid-state imaging device, a reset signal having a large amplitude needs to be applied to the gate of the reset transistor in order to accumulate electrons with negative charge in the diffusion layer. However, with the configuration of the present invention, electrons with positive charge are accumulated in the diffusion layer, and thus a reset signal having a small amplitude may be applied to the gate of the reset transistor.

Figure 4A:
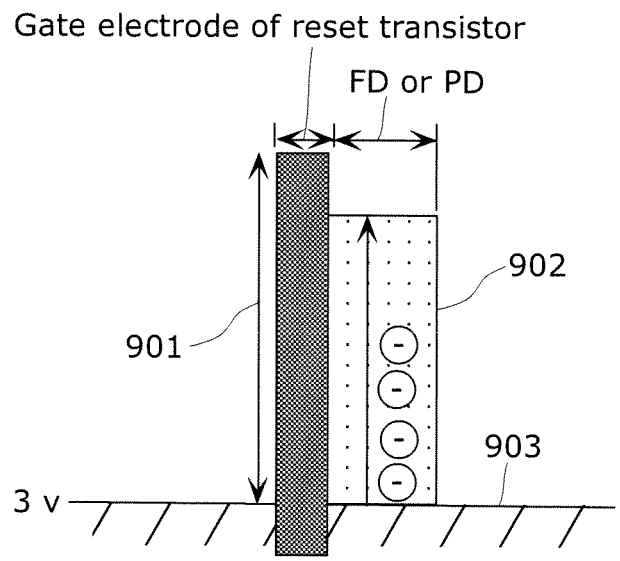
FIG. 4A is a potential diagram of a pixel in conventional art.
Figure 4B:
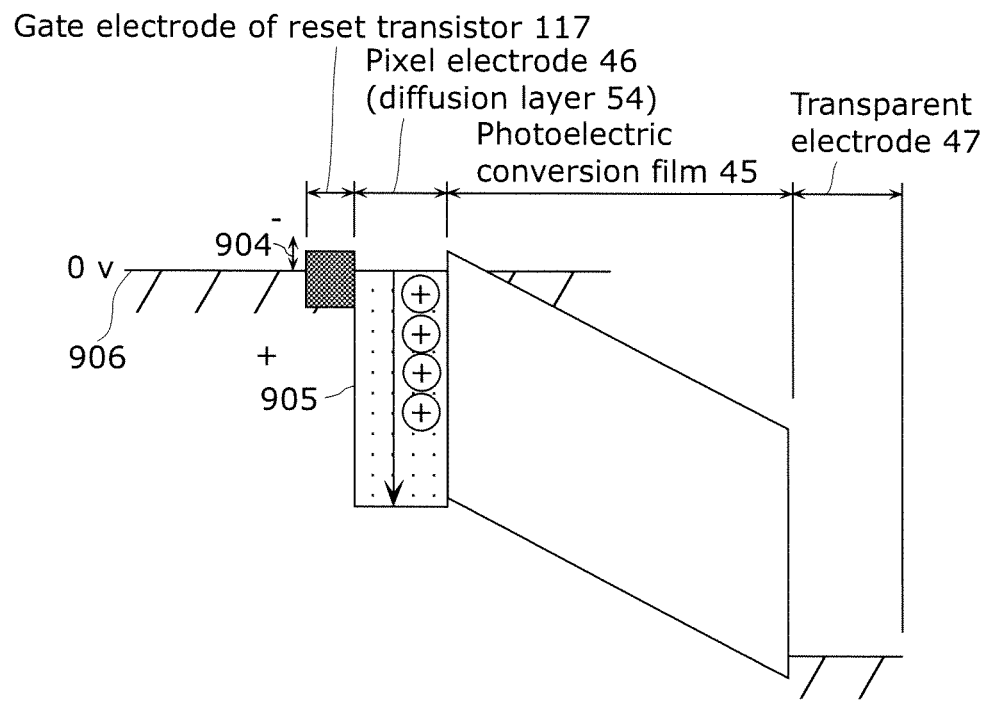
FIG. 4B is a potential diagram of a pixel in Embodiment 2.

FIG. 4A illustrates a potential diagram of a general solid-state imaging device with an embedded photodiode, and FIG. 4B illustrates a potential diagram of the layered solid-state imaging device of the present embodiment.

In the general solid-state imaging device with an embedded photodiode, an electric charge 902 (electron herein) is accumulated with the potential lower than a reference level 903 (for example, 3 v), and therefore, a reset signal having a large amplitude, like a reset signal 901 needs to be applied.

In contrast to the general solid-state imaging device, in a layered solid-state imaging device according to Embodiment 2, a positive voltage is applied to the photoelectric conversion film 45 so as to accumulate an electric charge 905 (positive hole herein) with the potential higher than a reference level 906 (for example, 0V), and thus a reset signal having a small amplitude, like a reset signal 904 may be applied.

The above configuration can be achieved by Embodiment, and fixed pattern noise due to a variation in the capacitance between the reset transistor 117 and the amplification transistor 113 in a reset OFF state can be reduced, and readout of signal charge with superimposed fixed pattern noise occurs less frequently, and consequently, the fixed pattern noise can be reduced.

Embodiment 3

In the above Embodiments 1 and 2, fixed pattern noise reduction using a feedback circuit in the solid-state imaging device has been described. The fixed pattern noise reduction in the above configuration can be achieved not only by adopting the configuration limited to the feedback circuit, but also by setting the reset amplitude to be small equivalent to 0V or close to 0V.

Figure 6A:
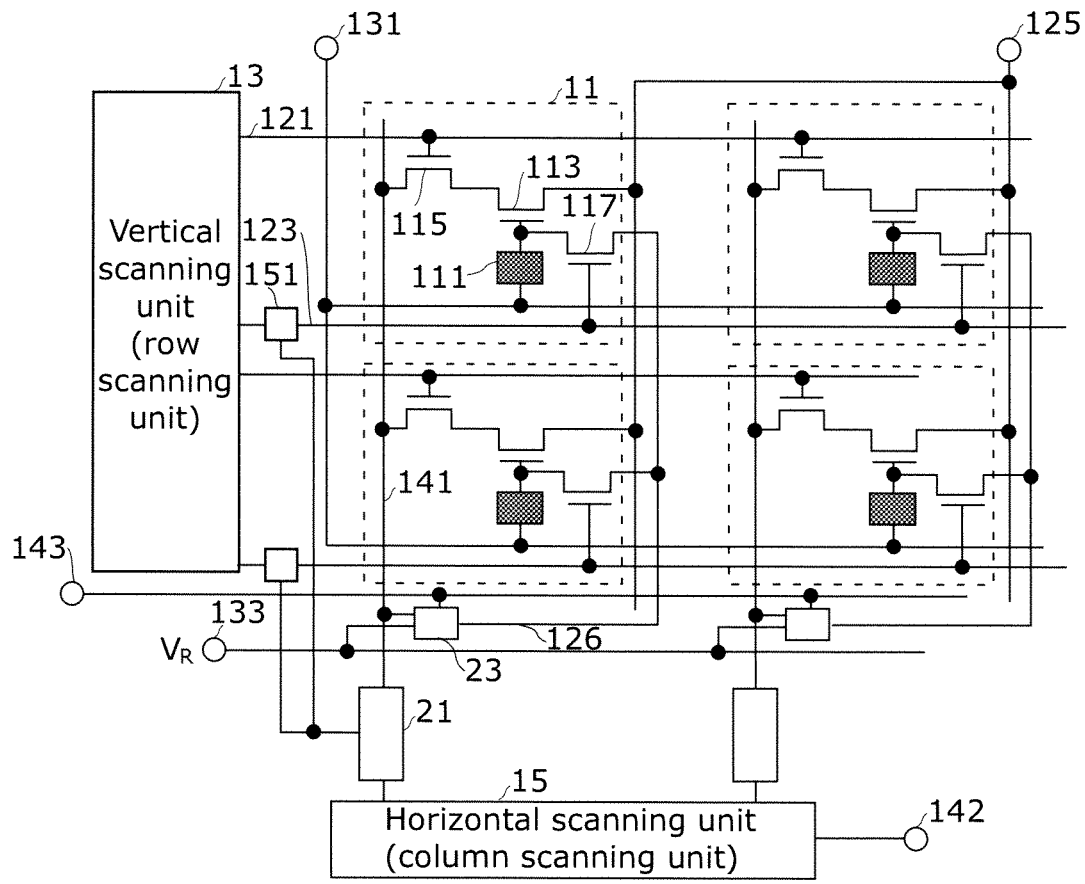
FIG. 6A is a circuit diagram illustrating a solid-state imaging device according to Embodiment 3.
Figure 6B:
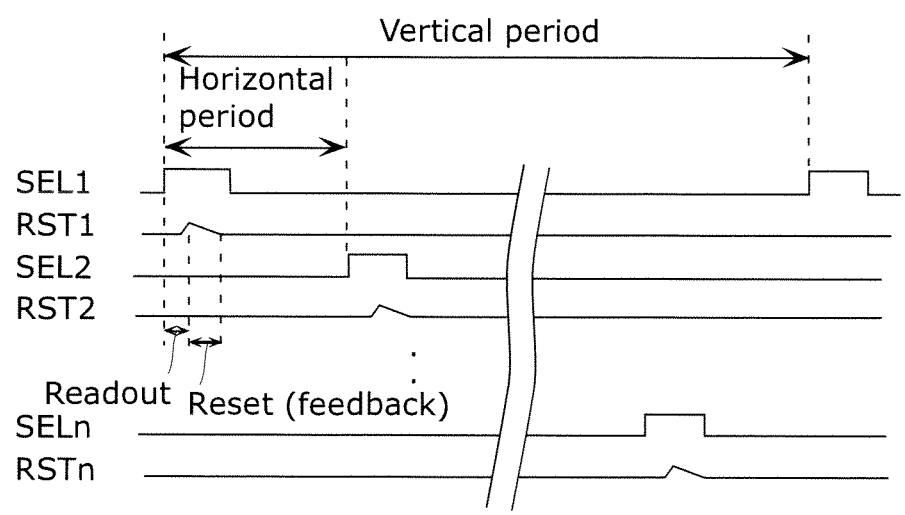
FIG. 6B is a time chart illustrating the operation of the solid-state imaging device according to Embodiment 3.

FIG. 6A is a circuit diagram illustrating a solid-state imaging device according to Embodiment 3. FIG. 6B is a time chart illustrating the operation of the solid-state imaging device according to Embodiment 3.

Specifically, the configuration of FIG. 6A mainly differs from the configuration of Embodiment 1 (FIG. 1) in that a reset signal control element 151 is added. Description of common points will be omitted, and different points will be mainly described below.

The reset signal control element 151 is a waveform adjusting unit configured to adjust the wave of a row reset signal which is to be applied to the gate of the reset transistor 117. The reset signal control element (waveform adjusting unit) 151 adjusts the waveform of the reset pulse included in a row reset signal so that the falling edge of the reset pulse is inclined, and supplies the adjusted row reset signal to the gate of the reset transistor 117. In other words, the reset signal control element (waveform adjusting unit) 151 adjusts the frequency band of the falling edge in a row reset signal.

FIGS. 7A to 7E each illustrate a circuit example of the reset signal control element 151 in FIG. 6A.

Figure 7A:
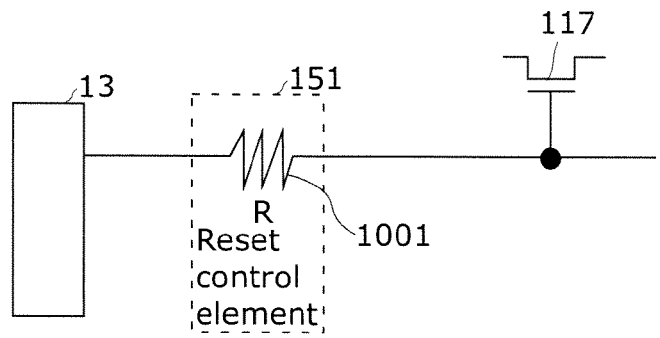
FIG. 7A is a diagram illustrating an example of a circuit of a reset signal control element.
Figure 7B:
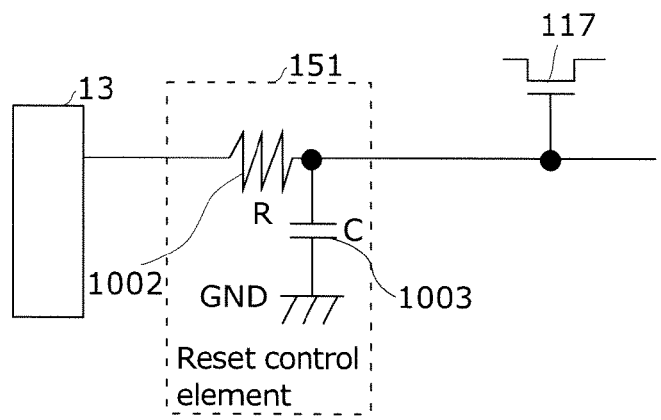
FIG. 7B is another diagram illustrating a circuit example of a reset signal control element.

The reset signal control element 151 may be a resistance element R (1001) as illustrated in FIG. 7A, filter circuits (RC filter circuits 1002, 1003) as illustrated in FIG. 7B, or a general tapered circuit as long as the reset signal control element 151 can adjust the reset signal inputted to the gate of the reset transistor 117 so as to adjust the reset band of the reset signal.

That is to say, the waveform of the reset signal outputted from the vertical scanning unit 13 is adjusted by using the reset signal control element 151, so that the reset band is adjusted.

Figure 7C:
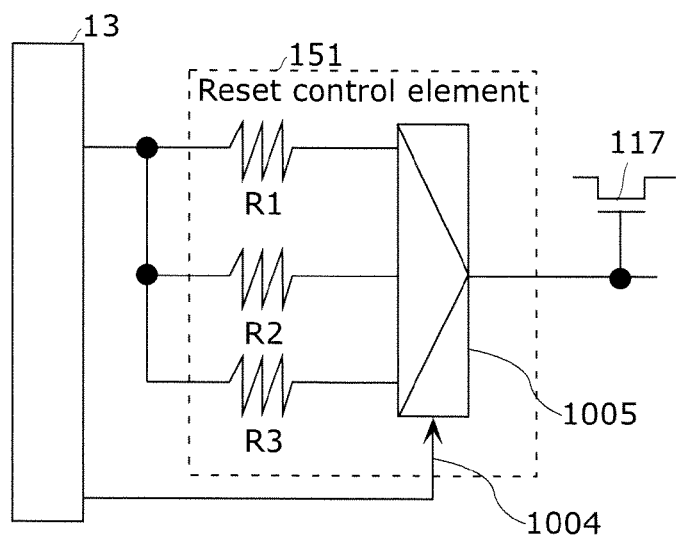
FIG. 7C is still another diagram illustrating a circuit example of a reset signal control element.

FIG. 7C illustrates a circuit example of the reset signal control element 151 where a plurality of resistance elements are used to allow a resistance value to be selected. The resistance values in the reset signal control element 151 satisfy the relationship of R3>R2>R1. A reset signal for which the reset band has been adjusted by passing the reset signal through a resistor is inputted to the gate of the reset transistor 117, the resistor having a resistance value selected by a selector 1005 with a resistance value selection signal 1004.

In the example of FIG. 7C, because R3 is greater than R1, the reset signal is weakened, and thus a longer time is necessary for the reset. According to a scene to be captured, the reset band can be adjusted. FIG. 7C illustrates a case where a resistance value can be selected from three resistance values, however, selectable resistance values are not limited.

FIG. 7B illustrates the RC filter circuits (1002, 1003), and the filter circuit configuration is not limited to this as long as the falling wave of the reset signal outputted from the vertical scanning unit 13 can be adjusted. Furthermore, a configuration may be adopted in which a plurality of changeable filter factors are provided (for example, a configuration in which the circuit values of RC filter circuits are changeable as illustrated in FIG. 7E), and a reset signal for which the reset band has been adjusted by passing the reset signal through a filter circuit is inputted to the gate of the reset transistor 117.

Figure 7D:
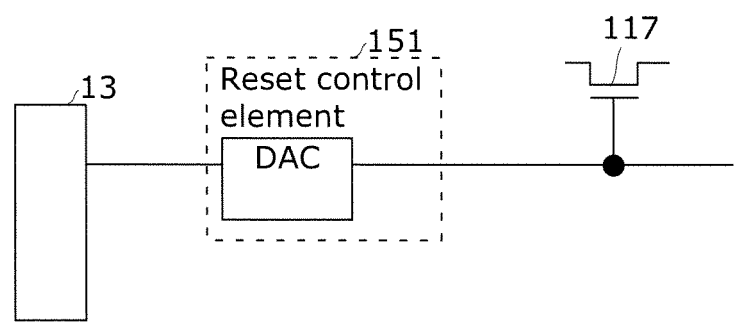
FIG. 7D is still another diagram illustrating a circuit example of a reset signal control element.
Figure 7E:
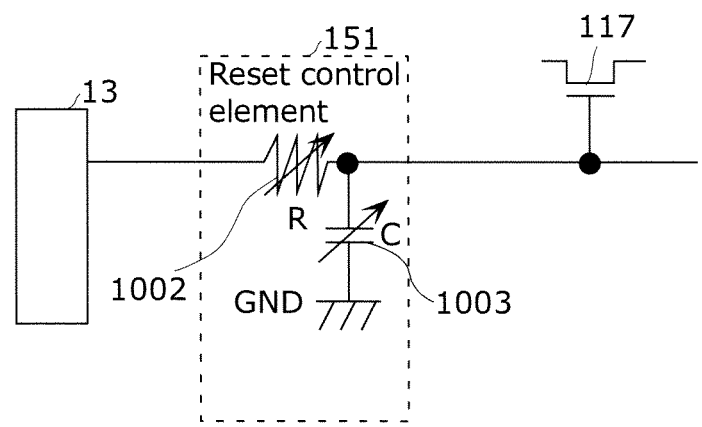
FIG. 7E is still another diagram illustrating a circuit example of a reset signal control element.

As illustrated in FIG. 7D, in the case where the reset signal control element 151 includes a tapered circuit, the column signal processing unit 21 on each column signal line 141 converts an analog output from each pixel 11 to a digital signal output, and a DAC circuit (D/A converter circuit) used in the tapered circuit may be used for adjusting the reset signal.

Embodiment 4

Figure 5:
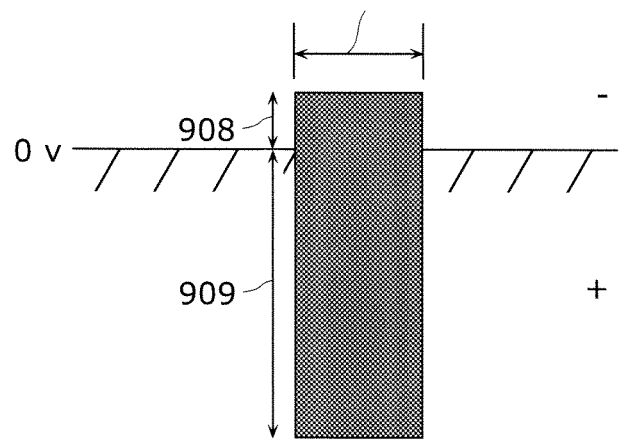
FIG. 5 is a diagram illustrating a reset amplitude when a reset transistor is controlled.

FIG. 5 illustrates the reset amplitude when the reset transistor 117 is controlled. A variation in the capacitance between the reset transistor 117 and the amplification transistor 113 occurs due to a reset amplitude 908 in a reset OFF state. However, because the amplitude in a reset OFF state has a small amplitude equivalent to 0V or close to 0V, the capacitance variation can be also reduced, and the fixed pattern noise can be reduced.

Because positive holes with positive electric charge are accumulated in the diffusion layer with a reset amplitude 909 in a reset ON state, a reset signal with a small amplitude may be applied to the gate of the reset transistor 117.

In the above process, the reset amplitude in a reset OFF state is smaller than the reset amplitude in a reset ON state.

The reset amplitude in a reset OFF state may be smaller than the power source voltage for driving the amplification transistor 113.

The reset amplitude in a reset OFF state may be smaller than the gate voltage of the selection transistor 115.

The reset amplitude in a reset OFF state may be smaller than the power source voltage of the inverting amplifier 23.

[Summary]

As described with reference to the drawings above, the inventors have found that in order to achieve a dimension of 1 μm or less for each pixel in a general solid-state imaging device, a first problem caused by a low optical absorption coefficient of crystalline silicon, and a second problem related to the amount of signal to be handled need to be solved.

The first problem will be described in detail. The optical absorption coefficient of crystalline silicon depends on the wavelength of light. Crystalline silicon having a thickness of approximately 3.5 μm is necessary in order to absorb almost all green light with a wavelength of approximately 550 nm which determines the sensitivity of the solid state imaging device, and to convert the green light to electricity. Therefore, the photodiode formed in the semiconductor substrate needs to have a depth of approximately 3.5 μm.

In the case where the dimension of each pixel is 1 μm, it is extremely difficult to form a photodiode having a depth of approximately 3.5 μm. Even when a photodiode having a depth of approximately 3.5 μm is formed, there is a high possibility that an inclined incident light may enter a photodiode of an adjacent pixel.

When an inclined incident light enters the photodiode of the adjacent pixel, color mixture (cross talk) occurs, which is a serious problem in a color solid-state imaging device. If a photodiode is formed with a less depth in order to prevent color mixture, the optical absorption efficiency of the photodiode for green light decreases, and the sensitivity of an image sensor deteriorates. Because the dimension of the pixel is reduced as the pixel is finely structured, the sensitivity of the pixel decreases, and thus further reduction in optical absorption efficiency causes a fatal problem.

The second problem will be described in detail. The amount of signal to be handled is determined by the saturation charge quantity of an embedded photodiode, which has a structure used in a general solid-state imaging device.

The embedded photodiode has an advantage in that signal charges accumulated inside the photodiode can be almost completely transferred (complete transfer) to an adjacent charge detection unit. For this reason, noise caused by charge transfer rarely occurs, and thus an embedded photodiode is widely used in a solid-state imaging device.

However, in order to achieve complete transfer, the capacitance of the photodiode per unit area cannot be increased. Thus, when the pixel is finely structured, reduction in saturation charge causes a problem.

In a compact digital camera, the saturation electron number per pixel needs to be at least 10000 electrons, however, when the dimension of the pixel is approximately 1.4 μm, the saturation electron number has an upper limit of about 5000 electrons. Nowadays, in order to cope with the reduction in saturation electron number, an image is produced by noise reduction processing or the like using digital signal processing technology, however, it is difficult to obtain a naturally reproduced image.

In the case of a high class single-lens reflex camera, it is said that the saturation electron number per pixel needs to be approximately 30000 electrons.

In a MOS image sensor using a crystalline silicon substrate, a structure is being reviewed that allows light to enter from the rear surface of the substrate which is thinly manufactured, the rear surface being opposite to the front surface on which pixel circuits are formed. However, the above approach only prevents incident light from being blocked by the wiring and the like included in the pixel circuits, and cannot solve the first and second problems.

However, a solid-state imaging device according to the embodiments of the present invention adopts a configuration in which a photoelectric conversion film is formed above the semiconductor substrate on which the pixel circuits are formed with an insulating film interposed between the photoelectric conversion film and the semiconductor substrate. Therefore, a material with a high optical absorption coefficient, such as amorphous silicon can be used in the photoelectric conversion film. For example, when amorphous silicon is used, most of green light with a wavelength of 550 nm can be absorbed by the photoelectric conversion film having a thickness of approximately 0.4 nm.

Additionally, because an embedded photodiode is not used, the capacitance of the photoelectric conversion unit can be increased, and the saturation charge can be increased. In addition, because charges are not completely transferred, additional capacitance can be further provided, and thus a sufficient amount of capacitance can be achieved even in pixels with a finer structure. Consequently, the second problem can be solved. A structure like a stacked cell in a dynamic random access memory can be adopted.

In a solid-state imaging device according to the embodiments of the present invention, the potential of the reset transistor is once reduced to a level lower than the ground potential by using the feedback circuit and a mechanism for controlling the amplitude of a reset signal.

Specifically, the solid-state imaging device includes a semiconductor substrate, a plurality of pixels arranged in rows and columns on the semiconductor substrate, a vertical signal line formed for each column, and an operational amplifier (inverting amplifier) connected to the vertical signal line. The pixel has a reset transistor, a selection transistor, an amplification transistor, and a photoelectric conversion unit which are formed on the semiconductor substrate, the photoelectric conversion unit has a photoelectric conversion film formed on the semiconductor substrate, a pixel electrode formed on the surface of the photoelectric conversion film that faces the semiconductor substrate, and a transparent electrode formed on the rear surface of the photoelectric conversion film that is opposite to the pixel electrode, the amplification transistor has a gate connected to the pixel electrode, the reset transistor has a drain connected to the pixel electrode, the amplification transistor has a source connected to the drain of the selection transistor, the selection transistor has a source connected to the vertical signal line, and when the selection transistor and the reset transistor are in a conduction state, the reset transistor receives the output of the selection transistor, and the output of the operational amplifier is connected to the source of the reset transistor, so that the gate potential of the amplification transistor has substantially the same potential as the reference voltage of the inverting amplifier.

Thus, by the feedback operation from the operational amplifier, the gate potential of the amplification transistor has substantially the same potential as the reference voltage of the inverting amplifier, and therefore, fixed pattern noise caused by a variation in Vth of the amplification transistor for each column is reduced. In addition, readout of signal charge with superimposed fixed pattern noise occurs less frequently, and consequently, the fixed pattern noise can be reduced.

In addition, the solid-state imaging device according to the embodiments of the present invention includes a semiconductor substrate, a plurality of pixels arranged in rows and columns on the semiconductor substrate, a vertical signal line formed for each column, and an operational amplifier connected to the vertical signal line. The pixel has a reset transistor, a selection transistor, an amplification transistor, and a photoelectric conversion unit which are formed on the semiconductor substrate, the photoelectric conversion unit has a photoelectric conversion film formed on the semiconductor substrate, a pixel electrode formed on the surface of the photoelectric conversion film that faces the semiconductor substrate, and a transparent electrode formed on the rear surface of the photoelectric conversion film that is opposite to the pixel electrode, the amplification transistor has a gate connected to the pixel electrode, the reset transistor has a drain connected to the pixel electrode, the amplification transistor has a source connected to the drain of the selection transistor, the selection transistor has a source connected to the vertical signal line, and when the selection transistor and the reset transistor are in a conduction state, the reset transistor receives the output of the selection transistor, the output of the operational amplifier is connected to the drain of the reset transistor, and by reading the signal from the pixel electrode with positive holes, the reset amplitude has a small amplitude equivalent to 0V or close to 0V, so that the gate potential of the amplification transistor has substantially the same potential as the reference voltage of the inverting amplifier.

Thus, by the feedback operation from the operational amplifier, the gate potential of the amplification transistor has substantially the same potential as the reference voltage of the inverting amplifier, and therefore, fixed pattern noise caused by a variation in Vth of the amplification transistor for each column is reduced. In addition, readout of signal charge with superimposed fixed pattern noise occurs less frequently, and consequently, the fixed pattern noise can be reduced.

In addition, by adopting a configuration in which the reset amplitude has a small amplitude equivalent to 0V or close to 0V, a variation in the capacitance between the reset transistor and the amplification transistor at the time of reading a signal charge in a reset OFF state is reduced, and thus fixed pattern noise can be reduced.

In addition, the solid-state imaging device according to the embodiments of the present invention includes a semiconductor substrate, a plurality of pixels arranged in rows and columns on the semiconductor substrate, and a vertical signal line formed for each column. The pixel has a reset transistor, a selection transistor, an amplification transistor, and a photoelectric conversion unit which are formed on the semiconductor substrate, the photoelectric conversion unit has a photoelectric conversion film formed on the semiconductor substrate, a pixel electrode formed on the surface of the photoelectric conversion film that faces the semiconductor substrate, and a transparent electrode formed on the rear surface of the photoelectric conversion film that is opposite to the pixel electrode, the amplification transistor has a gate connected to the pixel electrode, the reset transistor has a drain connected to the pixel electrode, the amplification transistor has a source connected to the drain of the selection transistor, the selection transistor has a source connected to the vertical signal line, and the amplitude of the reset signal applied to the gate in order to set the reset transistor in a conduction state has a small amplitude equivalent to 0V or close to 0V.

Thus, even in the configuration without a feedback circuit, the reset amplitude at the time of reading a signal in a reset OFF state has a small amplitude equivalent to 0V or close to 0V, and thus a variation in the capacitance between the reset transistor and the amplification transistor is reduced, and the fixed pattern noise can be reduced.

In the above-described embodiments, an example has been described in which the reset transistor 117 is an n-type MOS transistor, and the trailing edge of the reset pulse included in a reset signal inputted to the gate is a falling edge. However, in the case where the reset transistor 117 is a p-type MOS transistor, a reset pulse inputted to the gate is a negative pulse (downward pulse), and the trailing edge of the reset pulse is a rising edge. In this case, the reset signal control element (waveform adjusting unit) 151 adjusts the waveform of the reset pulse included in a row reset signal so that the trailing edge, i.e., the rising edge of the reset pulse is inclined, and supplies the adjusted row reset signal to the gate of the reset transistor 117. In other words, the reset signal control element (waveform adjusting unit) 151 adjusts the frequency band of the trailing edge, i.e., the rising edge in a row reset signal.

As described above, the solid-state imaging device in an embodiment of the present invention includes a plurality of pixels 11 arranged in rows and columns and a row scanning unit 13 configured to generate a row reset signal. Each of the pixels 11 has a reset transistor 117, a selection transistor 115, an amplification transistor 113, and a photoelectric conversion unit 111. The photoelectric conversion unit 111 has a photoelectric conversion film 45 which performs photoelectric conversion, a pixel electrode 46 formed on a surface of the photoelectric conversion film that faces the semiconductor substrate, and a transparent electrode 47 formed on a surface of the photoelectric conversion film that is opposite to the pixel electrode. The amplification transistor 113 has a gate connected to the pixel electrode 46, and outputs a signal voltage according to a potential of the pixel electrode 46 to a column signal line 141 via the selection transistor 115. The row scanning unit is configured to supply the row reset signal to a gate of the reset transistor, and an amplitude of the row reset signal is smaller than at least one of (a) a maximum voltage applied to a drain of the amplification transistor 113, (b) a maximum voltage applied to a gate of the selection transistor 115, (c) a power source voltage applied to the inverting amplifier 23, and (d) a maximum voltage applied to the transparent electrode.

Here, the solid-state imaging device may further include: a column signal line 141 formed for each column; an inverting amplifier 23 connected to the column signal line 141; and a feedback line 126 which is provided for each column and feeds back an output signal of the inverting amplifier 23 to the pixels 23 of a corresponding column, wherein the amplification transistor 113 has a gate connected to the pixel electrode 46, and outputs a signal voltage according to the potential of the pixel electrode 46 to the column signal line 141 via the selection transistor 115, and one of a source and a drain of the reset transistor 117 is connected to the pixel electrode 46, and the other of a source and a drain of the reset transistor is connected to a corresponding feedback line 126.

Here, the row scanning unit 13 may be further configured to receive an input of a row reset signal having a waveform that is unadjusted and an amplitude equivalent to a power source voltage, and to adjust a waveform of the row reset signal to reduce the amplitude of the row reset signal.

Here, an amplitude of the row reset signal applied to the gate of the reset transistor 117 may be smaller than the maximum voltage applied to the drain of the amplification transistor 13.

Here, an amplitude of the row reset signal applied to the gate of the reset transistor 117 may be smaller than the maximum voltage applied to the gate of the selection transistor 115.

Here, an amplitude of the row reset signal applied to the gate of the reset transistor 117 may be smaller than the power source voltage applied to the inverting amplifier 23.

Here, an amplitude of the row reset signal applied to the gate of the reset transistor 117 may be smaller than the maximum voltage applied to the transparent electrode 47.

Here, the amplitude of the row reset signal applied to the gate of the reset transistor 117 may be smaller than any one of (a) the maximum voltage applied to the drain of the amplification transistor 113, (b) the maximum voltage applied to the gate of the selection transistor 115, (c) the power source voltage applied to the inverting amplifier 23, and (d) the maximum voltage applied to the transparent electrode 47.

Here, the solid-state imaging device may further include a reset signal adjusting element (waveform adjusting unit) 151 configured to adjust a waveform of a row reset signal to be applied to the gate of the reset transistor 117, wherein the reset signal adjusting element (waveform adjusting unit) 151 is configured to adjust the waveform, so that a trailing edge of a reset pulse included in the row reset signal is inclined, and to supply the adjusted reset pulse to the gate of the reset transistor 117.

Here, the solid-state imaging device may have switchable functions of capturing an image at a first frame rate and capturing an image at a second frame rate higher than the first frame rate, and the reset signal adjusting element (waveform adjusting unit) 151 is configured to adjust an inclination of the trailing edge, so that a transition time required for falling or rising of the trailing edge of the reset pulse in the capturing at the first frame rate is longer than a transition time required for falling or rising of the trailing edge of the reset pulse in the capturing at the second frame rate.

Here, the reset signal adjusting element (waveform adjusting unit) 151 may be a filter circuit which is installed in a reset control line 123 connected to the gate of the reset transistor 117.

Here, the reset signal adjusting element (waveform adjusting unit) 151 may be configured to adjust an inclination of the trailing edge of the reset pulse by changing a circuit constant of the filter circuit.

Here, the reset signal adjusting element (waveform adjusting unit) 151 may include a digital-analog converter which outputs an analog signal as the row reset signal, the analog signal having an inclination at the trailing edge of the reset pulse.

Here, the solid-state imaging device may further include a reset signal adjusting element (waveform adjusting unit) 151 configured to adjust a waveform of a row reset signal to be applied to the gate of the reset transistor 117, wherein the reset signal adjusting element (waveform adjusting unit) 151 is configured to adjust a frequency band included in the trailing edge of the reset pulse in the row reset signal.

Here, an embodiment of a method for driving a solid-state imaging device is as follows.

Here, the solid-state imaging device includes a plurality of pixels 11 arranged in rows and columns on a semiconductor substrate 31 and a row scanning unit 13 configured to generate a row reset signal. Each of the pixels 11 has a reset transistor 117, a selection transistor 115, an amplification transistor 113, and a photoelectric conversion unit 111. The photoelectric conversion unit 111 has a photoelectric conversion film 45 which performs photoelectric conversion, a pixel electrode 46 formed on a surface of the photoelectric conversion film 45 that faces the semiconductor substrate 31, and a transparent electrode 47 formed on a surface of the photoelectric conversion film 45 that is opposite to the pixel electrode 46. The amplification transistor 113 has a gate connected to the pixel electrode 46, and outputs a signal voltage according to a potential of the pixel electrode 46 to a column signal line 141 via the selection transistor 115.

The driving method includes: outputting the output signal of the amplification transistor 113 to the column signal line 141 by enabling a row selection signal to the gate of the selection transistor 115; and supplying the row reset signal, to a gate of the reset transistor 117, the row reset signal having an amplitude smaller than at least one of (a) a maximum voltage applied to a drain of the amplification transistor 113, (b) a maximum voltage applied to the gate of the selection transistor 115, (c) a power source voltage applied to the inverting amplifier 23, and (d) a maximum voltage applied to the transparent electrode 47.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The solid-state imaging element according to the present invention can achieve a layered solid-state imaging device which can reduce fixed pattern noise, and particularly is effective as a small-sized, thin, image pickup device for capturing moving images.

The invention claimed is:
1. A solid-state imaging device, comprising:
a plurality of pixels arranged in rows and columns above a semiconductor substrate;
a row scanning unit configured to generate a row reset signal; and
an inverting amplifier formed for each column,
wherein each of the pixels has a reset transistor, a selection transistor, an amplification transistor, and a photoelectric conversion unit,
the photoelectric conversion unit has
a photoelectric conversion film which performs photoelectric conversion,
a pixel electrode formed on a surface of the photoelectric conversion film that faces the semiconductor substrate, and
a transparent electrode formed on a surface of the photoelectric conversion film that is opposite to the pixel electrode,
the amplification transistor has a gate connected to the pixel electrode, and outputs a signal voltage according to a potential of the pixel electrode to a column signal line via the selection transistor,
the row scanning unit is configured to supply the row reset signal to a gate of the reset transistor, and an amplitude of the row reset signal is smaller than at least one of
(a) a maximum voltage applied to a drain of the amplification transistor,
(b) a maximum voltage applied to a gate of the selection transistor,
(c) a power source voltage applied to the inverting amplifier, and
(d) a maximum voltage applied to the transparent electrode.

2. The solid-state imaging device according to claim 1, further comprising:
a column signal line formed for each column; and
a feedback line which is provided for each column and feeds back an output signal of the inverting amplifier to the pixels of a corresponding column,
wherein the inverting amplifier is connected to the column signal line, and
one of a source and a drain of the reset transistor is connected to the pixel electrode, and the other of a source and a drain of the reset transistor is connected to a corresponding feedback line.

3. The solid-state imaging device according to claim 2, wherein the row scanning unit is further configured to receive an input of a row reset signal having a waveform that is unadjusted and an amplitude equivalent to a power source voltage, and to adjust a waveform of the row reset signal to reduce the amplitude of the row reset signal.

4. The solid-state imaging device according to claim 2, wherein an amplitude of the row reset signal applied to the gate of the reset transistor is smaller than the maximum voltage applied to the drain of the amplification transistor.

5. The solid-state imaging device according to claim 2, wherein an amplitude of the row reset signal applied to the gate of the reset transistor is smaller than the maximum voltage applied to the gate of the selection transistor.

6. The solid-state imaging device according to claim 2, wherein an amplitude of the row reset signal applied to the gate of the reset transistor is smaller than the power source voltage applied to the inverting amplifier.

7. The solid-state imaging device according to claim 2, wherein an amplitude of the row reset signal applied to the gate of the reset transistor is smaller than the maximum voltage applied to the transparent electrode.

8. The solid-state imaging device according to claim 2, wherein the amplitude of the row reset signal applied to the gate of the reset transistor is smaller than any one of
(a) the maximum voltage applied to the drain of the amplification transistor,
(b) the maximum voltage applied to the gate of the selection transistor,
(c) the power source voltage applied to the inverting amplifier, and
(d) the maximum voltage applied to the transparent electrode.

9. The solid-state imaging device according to claim 1, further comprising
a waveform adjusting unit configured to adjust a waveform of a row reset signal to be applied to the gate of the reset transistor,
wherein the waveform adjusting unit is configured to adjust the waveform, so that a trailing edge of a reset pulse included in the row reset signal is inclined, and to supply the adjusted reset pulse to the gate of the reset transistor.

10. The solid-state imaging device according to claim 9, wherein the solid-state imaging device has switchable functions of capturing an image at a first frame rate and capturing an image at a second frame rate higher than the first frame rate, and
the waveform adjusting unit is configured to adjust an inclination of the trailing edge, so that a transition time required for falling or rising of the trailing edge of the reset pulse in the capturing at the first frame rate is longer than a transition time required for falling or rising of the trailing edge of the reset pulse in the capturing at the second frame rate.

11. The solid-state imaging device according to claim 9, wherein the waveform adjusting unit is a filter circuit which is installed in a reset control line connected to the gate of the reset transistor.

12. The solid-state imaging device according to claim 11, wherein the waveform adjusting unit is configured to adjust an inclination of the trailing edge of the reset pulse by changing a circuit constant of the filter circuit.

13. The solid-state imaging device according to claim 9, wherein the waveform adjusting unit includes a digital-analog converter which outputs an analog signal as the row reset signal, the analog signal having an inclination at the trailing edge of the reset pulse.

14. The solid-state imaging device according to claim 9, further comprising
a waveform adjusting unit configured to adjust a waveform of a row reset signal to be applied to the gate of the reset transistor,
wherein the waveform adjusting unit is configured to adjust a frequency band included in the trailing edge of the reset pulse in the row reset signal.

15. A driving method for a solid-state imaging device including:
a plurality of pixels arranged in rows and columns on a semiconductor substrate;
a row scanning unit configured to generate a row reset signal; and
an inverting amplifier formed for each column,
wherein each of the pixels has a reset transistor, a selection transistor, an amplification transistor, and a photoelectric conversion unit,
the photoelectric conversion unit has
a photoelectric conversion film which performs photoelectric conversion,
a pixel electrode formed on a surface of the photoelectric conversion film that faces the semiconductor substrate, and
a transparent electrode formed on a surface of the photoelectric conversion film that is opposite to the pixel electrode, and
the amplification transistor has a gate connected to the pixel electrode, and outputs a signal voltage according to a potential of the pixel electrode to the column signal line via the selection transistor,
the driving method comprising:
outputting the output signal of the amplification transistor to the column signal line by enabling a row selection signal to the gate of the selection transistor; and
supplying the row reset signal, to a gate of the reset transistor, the row reset signal having an amplitude smaller than at least one of
(a) a maximum voltage applied to a drain of the amplification transistor,
(b) a maximum voltage applied to the gate of the selection transistor, (c) a power source voltage applied to the inverting amplifier, and
(d) a maximum voltage applied to the transparent electrode.

* * * * *